(12) United States Patent
Mizuno

(10) Patent No.: US 8,867,669 B2
(45) Date of Patent: Oct. 21, 2014

(54) CIRCUIT AND METHOD FOR REMOVING FREQUENCY OFFSET, AND COMMUNICATION APPARATUS

(71) Applicant: LAPIS Semiconductor Co., Ltd., Tokyo (JP)

(72) Inventor: Koutaro Mizuno, Tokyo (JP)

(73) Assignee: LAPIS Semiconductor Co., Ltd., Tokyo (JP)

( * ) Notice: Subject to any disclaimer, the term of this patent is extended or adjusted under 35 U.S.C. 154(b) by 2 days.

(21) Appl. No.: 13/693,956

(22) Filed: Dec. 4, 2012

(65) Prior Publication Data

US 2013/0148762 A1 Jun. 13, 2013

(30) Foreign Application Priority Data

Dec. 9, 2011 (JP) .................................. 2011-270208

(51) Int. Cl.
*H04L 27/14* (2006.01)
*H04B 1/16* (2006.01)
*H03B 28/00* (2006.01)

(52) U.S. Cl.
CPC . *H03B 28/00* (2013.01); *H04B 1/16* (2013.01)
USPC ............ 375/334; 375/316; 375/335; 375/336

(58) Field of Classification Search
CPC ............... H04B 3/32; H04L 25/03343; H04L 2027/003; H04L 27/2647; H04L 27/14; H04L 27/1563; H04L 27/144; H04L 27/22; H04L 27/2332; H04L 27/2657; H04Q 1/46; H04N 5/4401

USPC .......................... 375/285, 316, 334–336, 344
See application file for complete search history.

(56) References Cited

U.S. PATENT DOCUMENTS 5,539,355 A * 7/1996 Nakamura .................... 329/302

FOREIGN PATENT DOCUMENTS

JP 11-298541 A 10/1999
JP 2009-071811 A 4/2009

* cited by examiner

*Primary Examiner* — Sam K Ahn
*Assistant Examiner* — Janice Tieu
(74) *Attorney, Agent, or Firm* — Studebaker & Brackett PC

(57) ABSTRACT

A circuit and a method for removing a frequency offset and a communication apparatus including the circuit, capable of removing the frequency offset by tracking rapidly and accurately in a payload section. A sequence of sample levels is obtained by sampling a frequency level of the baseband signal at every 0.5 symbol interval. Absolute values of differences between the frequency levels adjacent to each other at every 1 symbol are calculated as first difference absolute values. Absolute values of differences between the frequency levels adjacent to each other at every 1 symbol are calculated as second difference absolute values. When the first difference absolute values are greater than a predetermined first determination value or the second difference absolute values are less than a predetermined second determination value, the average value calculated is set as the frequency offset.

13 Claims, 7 Drawing Sheets

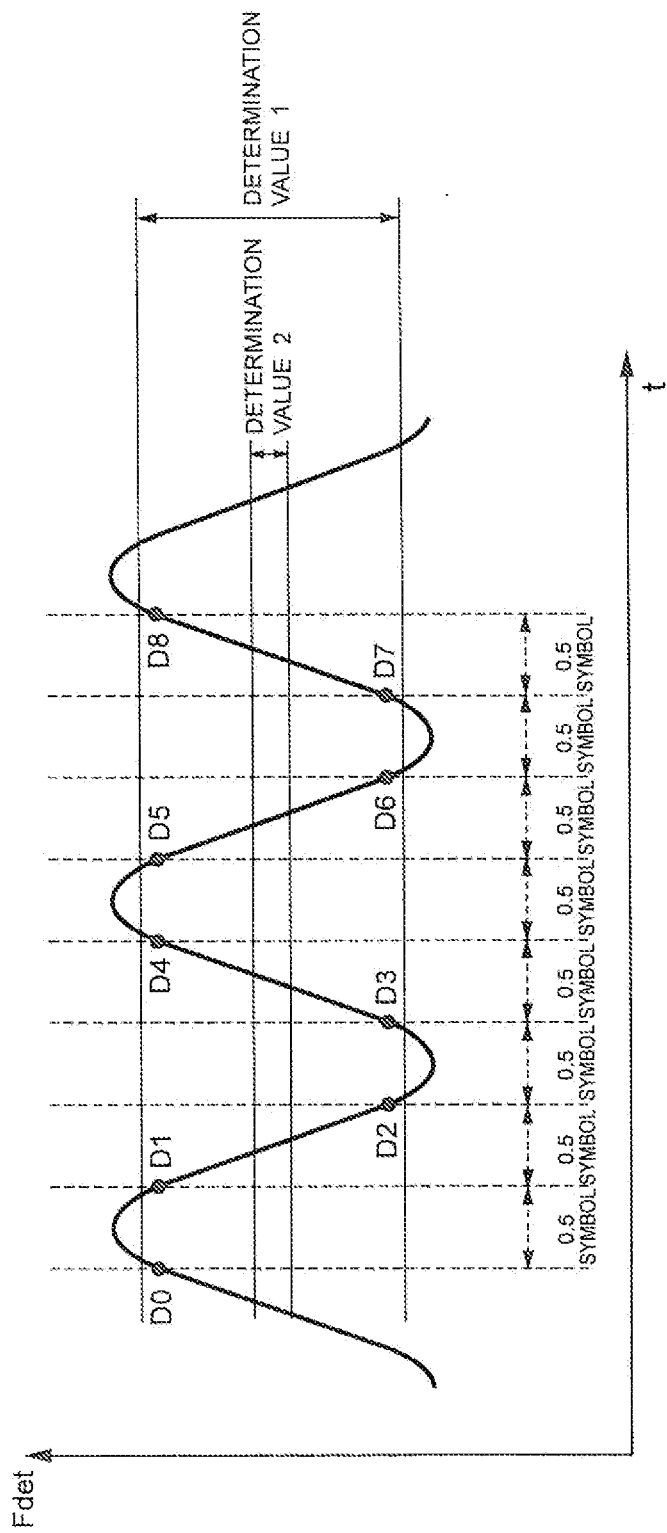

US 8,867,669 B2

CIRCUIT AND METHOD FOR REMOVING FREQUENCY OFFSET, AND COMMUNICATION APPARATUS

BACKGROUND OF THE INVENTION

1. Technical Field

The present invention relates to a circuit and a method for removing a frequency offset in a demodulator of a wireless communication system and a communication apparatus including the circuit.

2. Description of Related Art

In general, a demodulator of a wireless communication system includes, for example, a configuration of obtaining a digital detected signal (hereinafter, referred to as a baseband signal) representing a frequency shift level by detecting a signal subject to a modulation process, such as an FSK (Frequency Shift Keying), and a frequency offset removing circuit, such as an AFC (Automatic Frequency Control) circuit, for removing a frequency offset which exists in a corresponding baseband signal. When the frequency offset exists, a level comparison between a slice level, that is, a predetermined determination threshold value and a signal level of the baseband signal may not be exactly performed. In this regard, data values indicated by the base band signal, such as consecutive "0" or "1", is correctly determined by removing the frequency offset.

A method for removing a frequency offset has been known in the related art. See, for example, Japanese Patent Application Laid-open No. H11-298541 (Patent Literature 1). According to the above method, an amplitude average value of the baseband signal is calculated during a predetermined time period, and the amplitude average value serving as the frequency offset is removed. Further, another method for removing a frequency offset has been known in the related art. See, for example, Japanese Patent Application Laid-open No. 2009-71811 (Patent Literature 2). According to this method, an amplitude average value of a data pattern of a preamble added in a head of a received frame in a wireless communication system performing a burst communication is calculated, and the amplitude average value serving as a frequency offset.

However, as described in Patent Literature 1, in the method for removing an amplitude average value of a baseband signal during a predetermined time period as a frequency offset, when the predetermined time period is set short, tracking characteristic of the frequency offset removal from the baseband signal is increased, whereas the accuracy of the frequency offset removal is relatively low. To the contrary, when the predetermined time period is set long, the accuracy of the frequency offset removal is relatively increased, whereas the tracking characteristic of the frequency offset removal from the baseband signal is lowered. That is, there is a trade-off relation between the tracking characteristic of the frequency offset removal from the baseband signal and the accuracy of the frequency offset removal.

Further, as described in Patent Literature 2, in the method for removing an amplitude average value of a baseband signal during a predetermined time period as a frequency offset, when the offset occurs in a payload section after calculating the frequency offset from a preamble data pattern, the offset calculated from the preamble data pattern becomes a frequency offset that is not optimal to be removed, that is, there is a problem that a value of the frequency offset to be removed cannot be tracked to the extent of the payload section. Further, when an error occurs in detecting an access code before the preamble data is recognized, the preamble data pattern cannot be correctly recognized and the frequency offset cannot be calculated.

In order to solve the above-described problems, the present invention provides a circuit and a method for removing a frequency offset which can track rapidly and high-precisely the frequency offset to the extent of a payload section and remove the frequency offset and a communication apparatus including the circuit.

SUMMARY OF THE INVENTION

According to one aspect of the present invention, a circuit for removing a frequency offset of a baseband signal includes: a sampling part for sampling a frequency level of the baseband signal at every 0.5 symbol interval to obtain a sequence of sample levels, a first difference absolute value calculating part for calculating absolute values of differences between the frequency levels adjacent to each other at every 1 symbol based on an arbitrary first frequency level of the sample levels as a plurality of first difference absolute values, a second difference absolute value calculating part for calculating absolute values of differences between the frequency levels adjacent to each other at every 1 symbol based on a second frequency level of the sample levels after 0.5 symbol from the first frequency level as a plurality of second difference absolute values, an average calculating part for calculating an average value of the sample levels used for calculating the first and second difference absolute values, and a frequency offset holding part for setting the average value calculated by the average calculating part into the frequency offset when the first difference absolute values are greater than a predetermined first determination value or the second difference absolute values are less than a predetermined second determination value.

According to another aspect of the present invention, a method for removing a frequency offset includes setting a first frequency level as a frequency level at an arbitrary first timing of a baseband signal, and calculating absolute values of differences between frequency levels adjacent to each other at every 1 symbol based on the first timing as a plurality of first difference absolute values, setting a second frequency level as a frequency level of the baseband signal at a second timing after 0.5 symbol from the first timing, and calculating absolute values of differences between frequency levels adjacent to each other at every 1 symbol based on the second timing as a plurality of second difference absolute values, and calculating, as the frequency offset, at least one average value of a first average value as an average value of frequency levels used for calculating the first difference absolute value or a second average value as an average value of frequency levels used for calculating the second difference absolute value when the first difference absolute values are greater than a predetermined first determination value or the second difference absolute values are less than a predetermined second determination value.

According to still another aspect of the present invention a communication apparatus includes a detection part for detecting a received signal to generate a baseband signal, a frequency offset removing circuit for removing a frequency offset of the baseband signal, and a demodulating part for demodulating the received signal based on the baseband signal from which the frequency offset is removed. The communication apparatus includes a sampling part for sampling a frequency level of the baseband signal at every 0.5 symbol interval to obtain a sequence of sample levels, a first difference absolute value calculating part for calculating absolute values of differences between the frequency levels adjacent to each other at every 1 symbol based on an arbitrary first frequency level of the sample levels as a plurality of first difference absolute values, a second difference absolute value calculating part for calculating absolute values of differences between the frequency levels adjacent to each other at every 1 symbol based on a second frequency level of the sample levels after 0.5 symbol from the first frequency level as a plurality of second difference absolute values, an average calculating part for calculating an average value of the sample levels used for calculating the first and second difference absolute values, and a frequency offset holding part for setting the average value calculated by the average calculating part into the frequency offset when the first difference absolute values are greater than a predetermined first determination value or the second difference absolute values are less than a predetermined second determination value.

According to the circuit and the method for removing a frequency offset in a demodulator of a wireless communication system and the communication apparatus including the circuit of the present invention, a suitable determination threshold value for the baseband signal corresponding to the payload portion may be set. Further, there is no need to prepare a circuit for detecting the preamble portion to set the determination threshold value. In addition, since the determination threshold value may be renewed based on the data pattern which appears in the payload portion, a suitable determination threshold value can be set by tracking a variation of the offset.

BRIEF DESCRIPTION OF THE DRAWINGS

FIG. 5A is a time chart illustrating sample levels when a baseband signal is sampled with a sampling timing.

DETAILED DESCRIPTION OF THE EMBODIMENTS

Hereinafter, embodiments relating to the present invention will be described in detail with reference to the accompanying drawings.

<First Embodiment>

Figure 1:
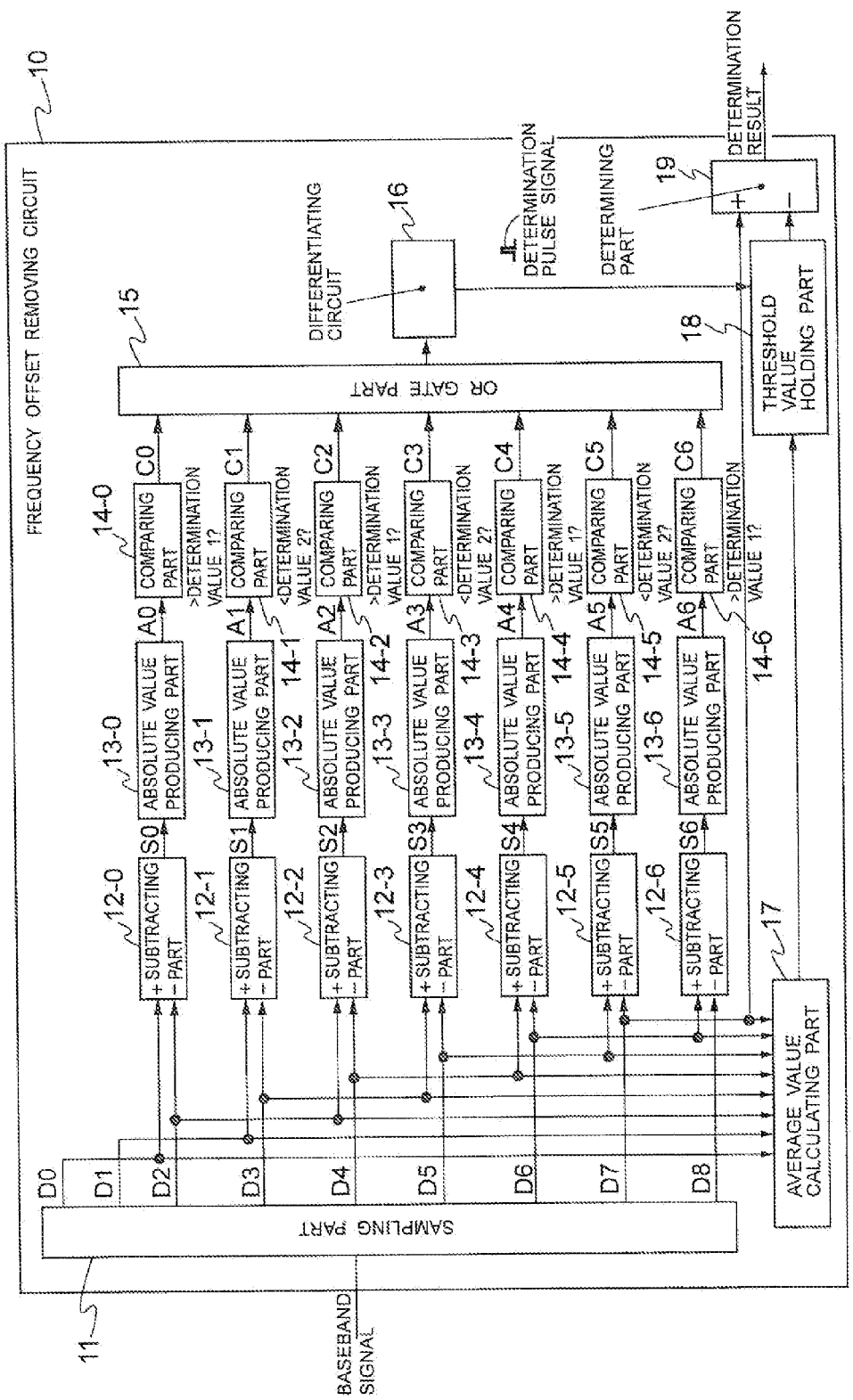
FIG. 1 is a block diagram illustrating the configuration of a circuit for removing a frequency offset according to a first embodiment.
Figure 3:
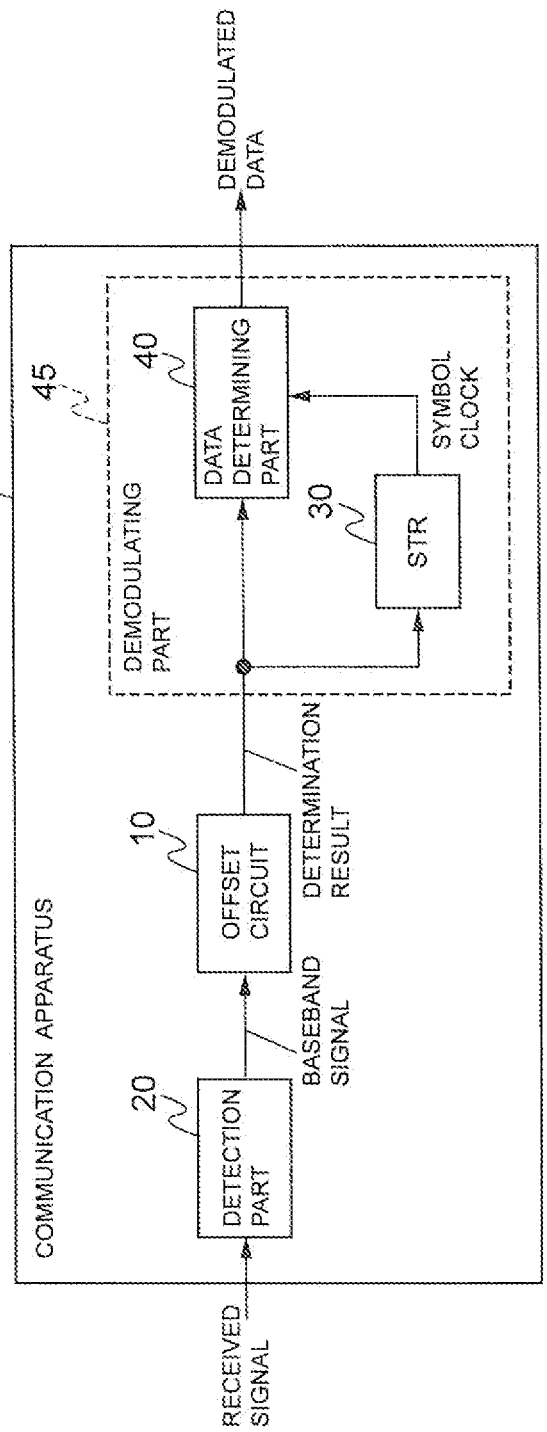
FIG. 3 is a block diagram illustrating the configuration of a communication apparatus including the circuit for removing a frequency offset of FIG. 1.

FIG. 1 illustrates the configuration of a circuit 10 for removing a frequency offset. The circuit 10 for removing a frequency offset is a circuit for exactly determining a data value represented by a baseband signal by removing a frequency offset when the frequency offset exists in the baseband signal provided from a detection part 20 (FIG. 3).

A sampling part 11 outputs the baseband signal provided from the detection part 20 (FIG. 3) after delaying the baseband signal.

Figure 2:
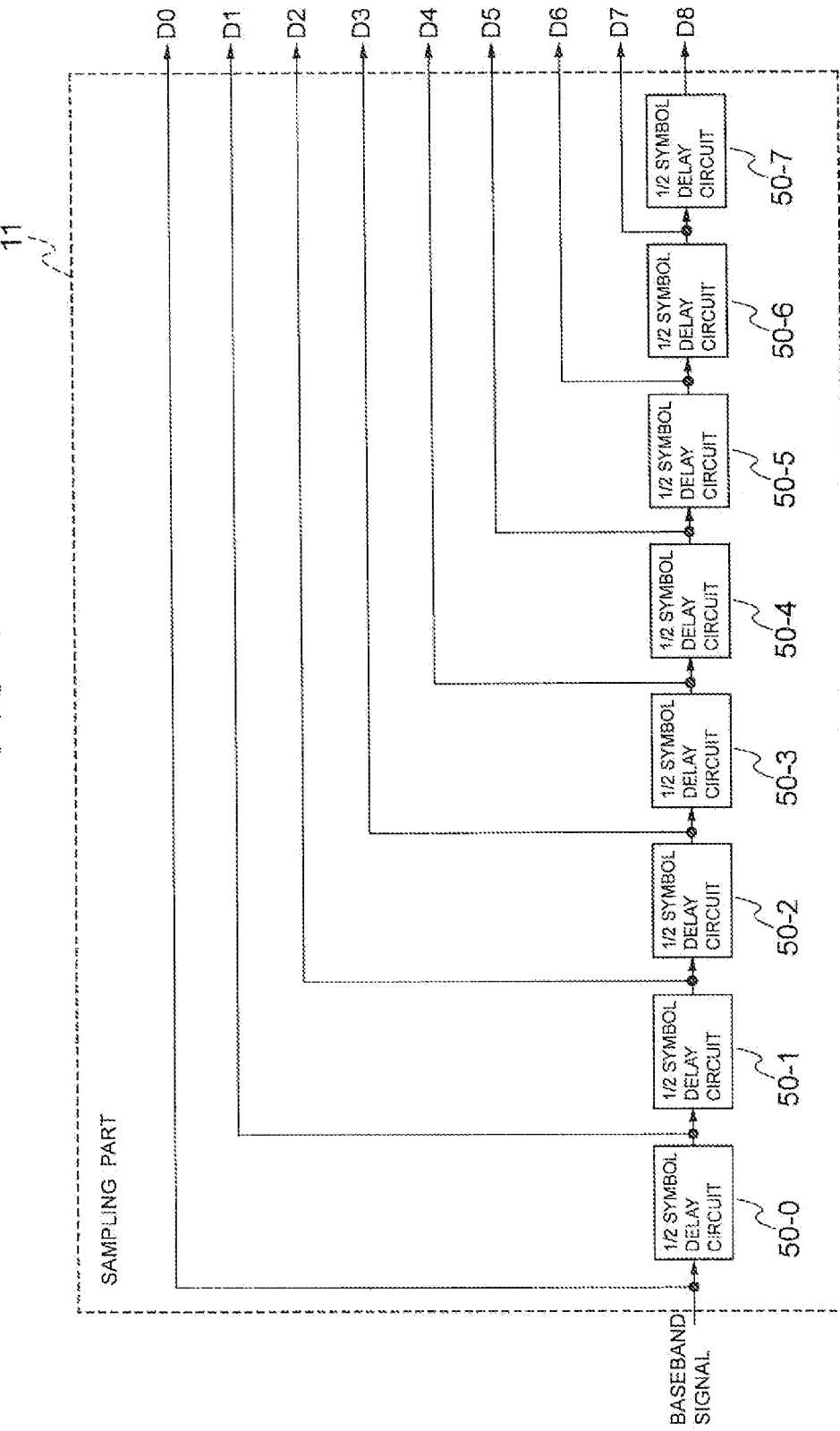
FIG. 2 is a block diagram showing a configuration of the sampling part of FIG. 1.

FIG. 2 illustrates the configuration of the sampling part 11. The sampling part 11 is able to sample the baseband signal at every 0.5 symbol interval to obtain a sequence of sample levels, and includes eight delay circuits 50-0 to 50-7 connected in series with each other. The 0.5 symbol interval may be a design value determined by, for example, a master clock frequency, a transmission rate and a stage level of delay circuits, and may not exclusively refer to an interval resulted from a manufacture error. Each of the delay circuits 50-0 to 50-7 delays an input signal for 0.5 symbols and outputs a delayed signal to a next step. According to this configuration, the baseband signal is delayed by 0, 0.5, 1, 1.5, 2.0, 2.5, 3, 3.5 and 4 symbols, and the signal levels D0, D1, D2, D3, D4, D5, D6, D7 and D8 are output, respectively. In other words, the sampling part 11 samples the frequency level of the baseband signal in units of 0.5 symbol during the sampling time period corresponding to 4 symbols to output signal levels (hereinafter, referred to as sample levels) D0, D1, D2, D3, D4, D5, D6, D7 and D8 obtained by the sampling. Further, 1 symbol corresponds to a half period of the baseband signal.

Subtracting parts 12-0 to 12-6 perform subtracting operations of the sample levels D0 to D8 output from sampling part 11. In detail, the subtracting part 12-0 outputs the difference between the sample levels D0 and D2 as a subtraction value S0, the subtracting part 12-1 outputs the difference between the sample levels D1 and D3 as a subtraction value S1, the subtracting part 12-2 outputs the difference between the sample levels D2 and D4 as a subtraction value S2, the subtracting part 12-3 outputs the difference between the sample levels D3 and D5 as a subtraction value S3, the subtracting part 12-4 outputs the difference between the sample levels D4 and D6 as a subtraction value S4, the subtracting part 12-5 outputs the difference between the sample levels D5 and D7 as a subtraction value S5, and the subtracting part 12-6 outputs the difference between the sample levels D6 and D8 as a subtraction value S6.

Absolute value producing parts 13-0 to 13-6 output absolute values (hereinafter, referred to as difference absolute values) A0 to A6 of the subtraction values S0 to S6. Hereinafter, the subtracting parts 12-0, 12-2, 12-4 and 12-6 and the absolute value producing parts 13-0, 13-2, 13-4 and 13-6 will be collectively referred to as a first difference absolute value calculating part. Further, the subtracting parts 12-1, 12-3 and 12-5 and the absolute value producing parts 13-1, 13-3 and 13-5 will be collectively referred to as a second difference absolute value calculating part.

The operation of calculating part will be described below in more detail. That is, the first difference absolute value calculating part calculates each of difference absolute values (hereinafter, referred to as the first difference absolute values) between the sample levels adjacent to each other every 1 symbol interval, based on an arbitrary one (hereinafter referred to as a first frequency level) of the sample levels D1 to D8. In other words, it is assumed that a first frequency level is a frequency level of a baseband signal at an arbitrary timing (hereinafter referred to as a first timing), and the first difference absolute value calculating part calculates the difference absolute values between frequency levels adjacent to each other every 1 symbol interval based on the first timing as the first difference absolute values.

The second difference absolute value calculating part calculates each of difference absolute values (Hereinafter, referred to as second difference absolute values) between the sample levels adjacent to each other every 1 symbol interval, based on a sample level (hereinafter referred to as a second frequency level) after 0.5 symbol from the first frequency level of the sample levels D1 to D8. In other words, it is assumed that a second frequency level is a frequency level of a baseband signal at a timing (hereinafter referred to as a second timing) after 0.5 symbol from the first timing, and the second difference absolute value calculating part calculates the difference absolute values between frequency levels adjacent to each other every 1 symbol interval based on the second timing as the second difference absolute values.

Hereinafter, comparing parts 14-0 to 14-6, a differentiating circuit 16 and a threshold value holding part 18 will be collectively referred to as a frequency offset holding part. When all of the first difference absolute values A0, A2, A4 and A6 is greater than a predetermined first determination value 1 and all of the second difference absolute values A1, A3 and A3 is less than a predetermined second determination value 2, the frequency offset holding part sets an average value calculated at an average value calculating part 17 as the frequency offset.

The comparing parts 14-0 to 14-6 compare the difference absolute values A0 to A6 with the first and second determination values (hereinafter, referred to as determination values 1 and 2) which are predetermined.

In detail, the comparing part 14-0 outputs a comparison result value C0 of a logic value '1' when the difference absolute value A0 is greater than the determination value 1. The comparing part 14-0 outputs the comparison result value C0 of a logic value '0' when the difference absolute value A0 is equal to or less than the determination value 1. Likewise, the comparing parts 14-2, 14-4 and 14-6 output comparison result values C2, C4 and C6 of the logic value '1', respectively, when the difference absolute values A2, A4 and A6 are greater than the determination value 1. Otherwise, the comparing parts 14-2, 14-4 and 14-6 output comparison result values C2, C4 and C6 of the logic value '0', respectively.

Further, the comparing part 14-1 outputs a comparison result value C1 of a logic value '1' when the difference absolute value A1 is less than the determination value 2. The comparing part 14-1 outputs the comparison result value C1 of a logic value '0' when the difference absolute value A1 is equal to or greater than the determination value 2. Likewise, the comparing parts 14-3 and 14-5 output comparison result values C3 and C5 of the logic value '1' when the difference absolute values A3 and A5 are less than the determination value 2, respectively. Otherwise, the comparing parts 14-3 and 14-5 output comparison result values C3 and C5 of the logic value '0', respectively.

According to this configuration, if each of the first difference absolute values A0, A2, A4 and A6 is greater than the first determination value 1 and each of the difference absolute values A1, A3 and A5 is less than the second determination value 2, all of the comparison result values C0 to C6 has the logic value '1'. Hereinafter, the difference absolute values A0, A2, A4 and A6 will be referred to as peak type absolute values and the difference absolute values A1, A3 and A5 will be referred to as midpoint type absolute values.

The peak type absolute values and/or the midpoint type absolute values are able to be manually controlled by, for example, a user's determination in consideration of a level of the baseband signal in an amplitude direction or a an expected offset magnitude. The manual control is performed by, for example, inputting a determination value changing signal from an external. The determination value changing signal is allowed to appoint one among plural determination values which the comparing parts 14-0 to 14-6 previously possess as the peak type determination values or the midpoint type determination values, or to directly set the determination value as a numerical value. Further, for example, the comparing parts 14-0 to 14-6 is allowed to be automatically controlled by the comparing parts 14-0 to 14-6 according to a transmission scheme signal (not shown) representing a transmission scheme in use. The transmission scheme signal is allowed, for example, to be included in a received frame or individually provided from an external.

An OR gate part 15 performs OR operations of the comparison result values C0 to C6. When all of the comparison result values C0 to C6 has the logic value of "1", the OR gate part 15 provides the logic value of "1" to the differentiating circuit 16. When at least one of the comparison result values C0 to C6 has the logic value of "0", the OR gate part 15 provides the logic value of "0" to the differentiating circuit 16.

The differentiating circuit 16 detects a rising edge while the logic value is transited from "0" to "1", thereby generating a determination pulse signal. The differentiating circuit 16 provides the determination pulse signal to the threshold value holding part 18. Hereinafter, the comparing parts 14-0 to 14-6 and the OR gate part 15 will be collectively referred to as a pulse generating part.

The average value calculating part 17 calculates an average value of the sample levels D0 to D7 used for calculating the first and second difference absolute values and provides the average value to threshold value holding part 18.

The average value is input to the threshold value holding part 18 at the timing when the determination pulse signal is provided from the differentiating circuit 16, and the threshold value holding part 18 holds the average value as the determination threshold value.

A determining part 19 compares the determination threshold value held in the threshold value holding part 18 with the sample level D7. For example, when the sample level D7 is greater than a corresponding determination threshold value, the determining part 19 outputs the logic value of "1" as the determination result, and when the sample level D7 is less than the corresponding determination threshold value, the determining part 19 outputs the logic value of "0" as the determination result.

FIG. 3 illustrates a configuration of a communication apparatus 100 including the circuit 10 for removing a frequency offset.

For example, the detection part 20 provides the baseband signal obtained by detecting a frequency of a received signal, such as a wireless transmitted IF (Intermediate Frequency) signal, to the circuit 10 for removing a frequency offset.

A symbol clock recovering part 30 (hereinafter, referred to as an STR (Symbol Timing Recovery)) recovers a symbol clock based on a determination result output from the circuit 10 for removing a frequency offset.

A data determining part 40 determines whether the data value of the determination result output from the determining part 19 is the logic value of "0" or "1" in synchronization with the symbol clock recovered by the STR 30. The data determining part 40 outputs the corresponding determination result as a demodulated data. Hereinafter, the STR 30 and the data determining part 40 will be collectively referred to as a demodulating part 45. The demodulating part 45 demodulates the received signal based on the baseband signal from which the frequency offset is removed.

Figure 4:
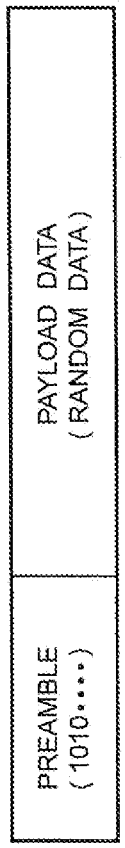
FIG. 4 is a diagram illustrating an example of a received-frame format.

FIG. 4 illustrates one example of a received frame format. The preamble is added in front of payload data. For example, the preamble has the data pattern of repeating "0" and "1" such as a logic value of "010101 . . . ". Further, the data pattern of repeating "0" and "1" may appear in the payload as well as the preamble. The circuit 10 for removing a frequency offset may set the determination threshold value when the detected frequency has the data pattern of repeating "0" and "1" regardless of whether a sampling target portion of the detected frequency corresponds to a preamble or a payload.

Hereinafter, a setting operation of the determination threshold value by the circuit 10 for removing a frequency offset will be described with reference to FIGS. 1, 5A and 5B.

Figure 5B:
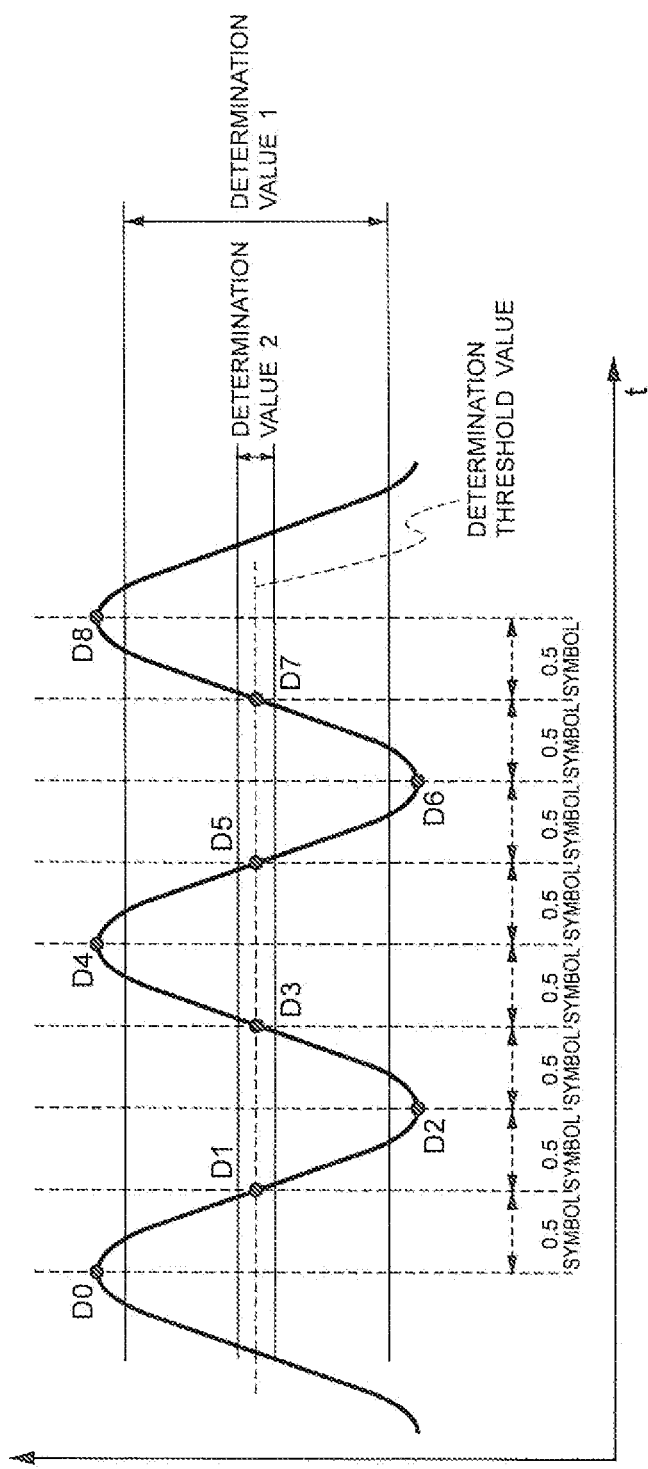
FIG. 5B is a time chart illustrating sample levels when a baseband signal is sampled with another sampling timing.

FIGS. 5A and 5B illustrate one example of the data band signal obtained by frequency-detecting the frequency modulated signal of the repeating data of logic values "010101 . . . ". Hereinafter, the operation of the circuit 10 for removing a frequency offset in receiving this baseband signal will be described.

The sampling part 11 samples the frequency level of the baseband signal every 0.5 symbol interval to obtain the sample levels D0 to D8. The subtracting parts 12-0 to 12-6 output the differences values between D0 and D2, D1 and D3, D2 and D4, D3 and D5, D4 and D6, D5 and D7, and D6 and D8 as the subtraction values S0 to S6. The absolute value producing parts 13-0 to 13-6 output the difference absolute values A0 to A6 of the subtraction values S0 to S6.

The comparing parts 14-0 to 14-6 compare each of the difference absolute values A0, A2, A4 and A6 with the determination value 1 and compare each of the difference absolute values A1, A3 and A5 with the determination value 2. The comparing parts 14-0 to 14-6 output the logic value of "1" as all of the comparison result values C0 to C6 when the conditions are satisfied that the difference absolute values A0, A2, A4 and A6 are greater than the determination value 1 and the difference absolute values A1, A3 and A5 are less than the determination value 2.

The followings may be determined by determining whether the conditions are satisfied or not. First, it may be determined whether the data value represented by the frequency levels of the baseband signal, which is a sampling target, has a data pattern of repeating "0" and "1" such as "0101 . . . " or "1010 . . . ", based on the comparisons between each of the difference absolute values A0, A2, A4 and A6 with the determination value 1. Second, based on the comparisons between each of the difference absolute values A1, A3 and A5 with the determination value 2, it may be determined whether the difference between amplitude midpoints adjacent to each other is small, that is, whether the frequency level of the baseband signal, which is the sampling target, is not dispersed by a variation of the frequency offset during the corresponding sampling operation.

Further, even if the data value represented by the frequency level of the baseband signal is "1010 . . . ", for example, if the sampling timing is set as shown in FIG. 5A, the corresponding condition is not satisfied. However, if the sampling timing of the sampling part 11 is gradually reduced at an interval less than 0.5 symbol, when the sampling timing is set as shown in FIG. 5B, the corresponding condition is satisfied.

Figure 6:
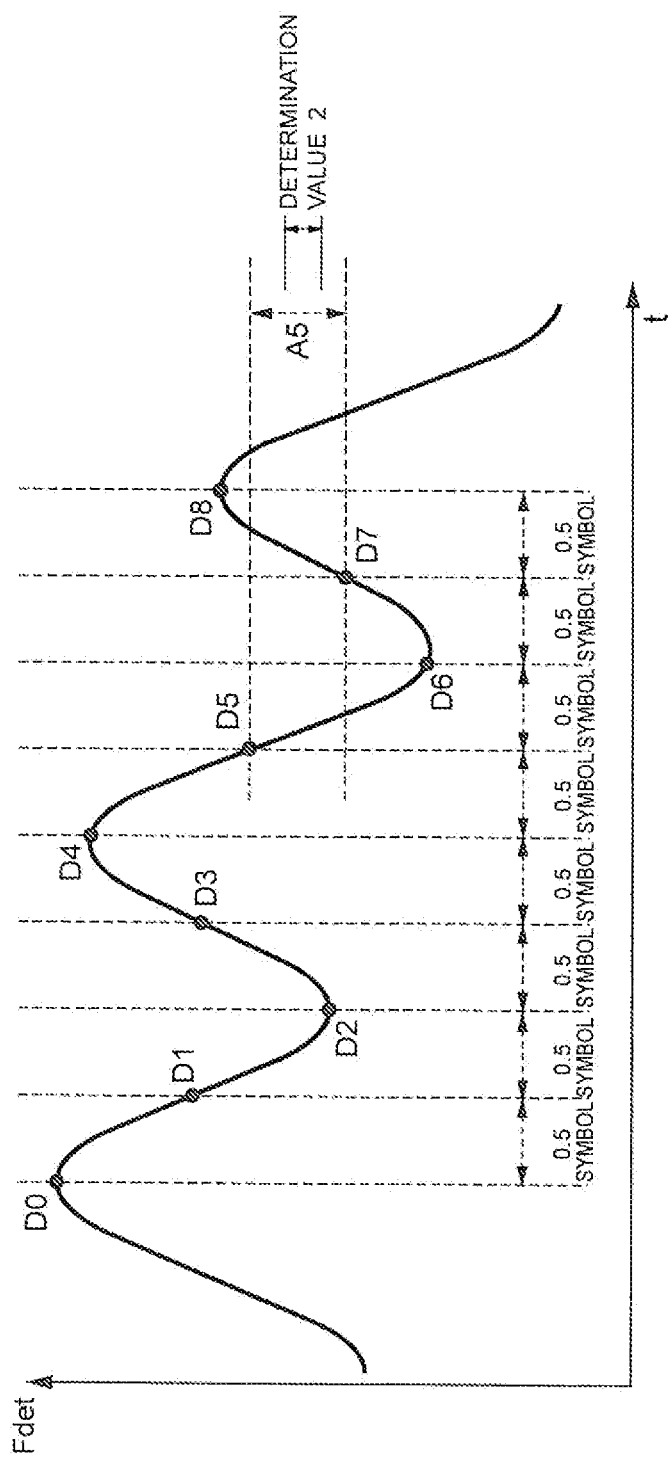
FIG. 6 is a time chart illustrating another baseband signal together with sample levels.

Further, when the frequency level of the baseband signal is dispersed by the variation of the frequency offset magnitude during the sampling period as shown in FIG. 6, the difference between the sample levels D5 and D7 is greater than the determination value 2, so that the condition is not satisfied.

The OR gate part 15 obtains the logic OR of the comparison result values, and outputs the result. When the condition is satisfied, that is, all logic values of the comparison result values C0 to C6 are "1", the OR gate part 15 provides the logic value of "1" to the differentiating circuit 16. Meanwhile, when at least one logic value of the comparison result values C0 to C6 is "0", the OR gate part 15 provides the logic value of "0" to the differentiating circuit 16.

When the logic value provided from the OR gate part 15 is changed from the logic value of "0" to the logic value of "1", the differentiating circuit 16 detects the rising edge to generate the determination pulse signal. The differentiating circuit 16 supplies the determination pulse signal to the threshold holding part 18. The average value calculating part 17 calculates the average value of the signal levels of the sample levels D0 to D7 and provides the average value to the threshold holding part 18. The threshold holding part 18 receives the average value provided from the average value calculating part 17 at the timing when the differentiating circuit 16 provides the determination pulse signal, and holds the average value serving as the determination threshold value.

In FIG. 5B, the average value of the signal levels of the sample levels D0 to D7 is the amplitude midpoint of the baseband signal. Further, in FIG. 5B, since the all logic values of the comparison result values C0 to C6 are "1", the threshold value holding part 18 holds the corresponding average value as the determination threshold value. Further, in FIGS. 5A and 6, since all logic values of the comparison result values C0 to C6 are not "1", the threshold value holding part 18 does not adapt the calculated average value as the determination threshold value. That is, in this case, the threshold value holding part 18 does not set the determination threshold value.

The determining part 19 compares the sample level D7 with the determination threshold value held and supported by the threshold value holding part 18. When the determining part 19 determines that the sample level D7 is greater than the determination threshold value, the determining part 19 outputs, for example, the logic value of "1", and when the sample level D7 is less than the determination threshold value, the determining part 19 outputs, for example, the logic value of "0".

As described above, according to the circuit 10 for removing a frequency offset, regardless of whether the sampling target portion of the detected frequency is a preamble or a payload, the circuit 10 may set the determination threshold value when it is determined that the detected frequency has the data pattern of repeating "0" and "1". Specifically, since the corresponding setting is performed when the detected frequency is not dispersed by the variation of the frequency offset, a suitable determination threshold value may be set and the frequency offset may be removed even if the data pattern of a payload portion, which is considered as the variation of the frequency offset is easily caused as compared with the preamble, is sampled in order to set the threshold value. Thus, according to the circuit 10 for removing a frequency offset of the embodiment, since a suitable determination threshold value may be set, the accuracy of removing the frequency offset may be improved.

Further, since the determination threshold value is set when the data pattern of repeating "0" and "1" appears in the payload, even if the frequency offset value is changed over time, the suitable determination threshold value may be frequently reset by tracking the corresponding variation. Further, even if an unsuitable determination threshold value is set due to incorrect recognition of other data as the preamble data before the preamble data arrives, when the data pattern of repeating "0" and "1" appears, the suitable determination threshold value may be reset. By this reset, data after the reset may be correctly determined. Thus, according to the circuit 10 for removing a frequency offset of the embodiment, a high tendency of tracking the variation of the frequency offset may be realized.

Therefore, according to the circuit 10 for removing a frequency offset of the embodiment, the suitable determination threshold value may be set by tracking the variation of the frequency offset, and, at the same time, the tracking and accuracy of removing the frequency offset from the baseband signal are compatible.

Further, although the embodiment illustrates one example case in which an FSK modulated baseband signal is a processing object, the embodiment is not limited to above. For example, the circuit of removing a frequency offset of the present invention is applicable for a PSK (phase shift keying) modulated phase detecting signal or an ASK (amplitude-shift keying) modulated amplitude detecting signal.

Further, although the embodiment illustrates one example case in which data having a preamble is a processing object, the embodiment is not limited thereto. Even when the data does not have any preamble, if the data pattern of repeating "0" and "1" appears, the above effect may be achieved.

Further, although the embodiment illustrates one example of setting the determination threshold value based on nine sample levels D0 to D8, which are obtained from the data pattern of "10101" (FIGS. 5A and 5B), the embodiment is not limited thereto. For example, an arbitrary data pattern length such as "1010" or "10101010" may be the sampling object. The data pattern length of the sampling object is allowed to be shorter than that of the preamble. Further, according to the data pattern length, the number of stage levels of the subtracting parts 12-0 to 12-6, the abstract value calculating parts 13-0 to 13-6 and the comparing parts 14-0 to 14-6 is allowed to be increased.

Further, although the embodiment illustrates that the average value calculating part 17 calculates the average value of the sample levels D0 to D7 and the threshold value holding part 18 holds the average value as the determination threshold value, the embodiment is not limited thereto. The average calculating part 17 may calculate the average value of the sample levels D0, D2, D4 and D6 (hereinafter, referred to as the first average value) used for calculating the first difference absolute values A0, A2, A4 and A6 and the average value of the sample levels D1, D3 and D5 (hereinafter, referred to as the second average value) used for calculating the second difference absolute values A1, A3 and A5. In addition, the average calculating part 17 may calculate the average value (hereinafter, referred to as the third average value) of the first and second average values. In this case, the threshold value holding part 18 holds one of the first to third average values as the determination threshold value.

<Second Embodiment>

Figure 7:
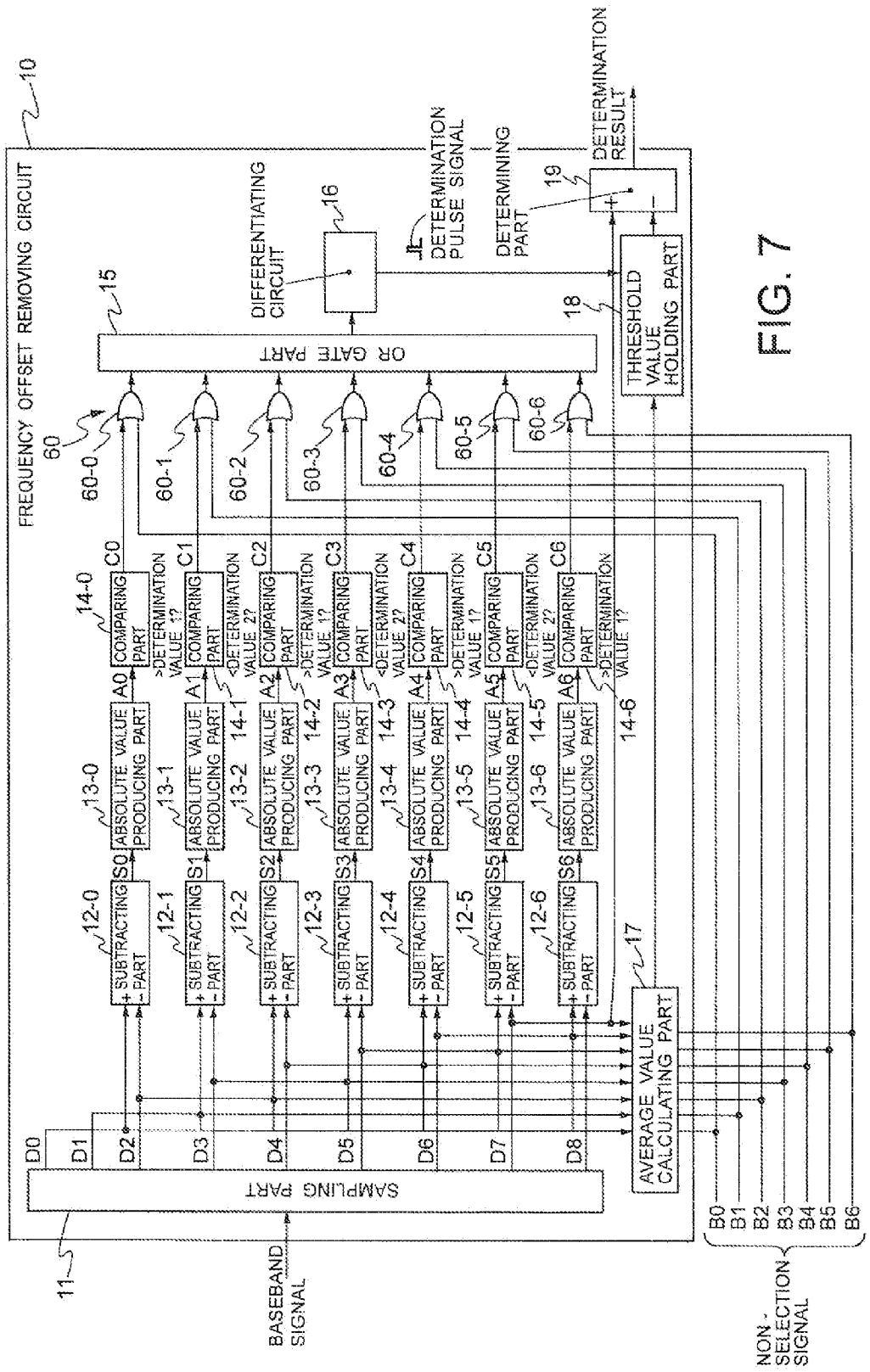
FIG. 7 is a block diagram illustrating the configuration of a circuit for removing a frequency offset according to a second embodiment.

FIG. 7 illustrates a configuration of a circuit 10 for removing a frequency offset of the embodiment. The following description will made while focusing on parts different from those of the first embodiment.

The circuit 10 for removing a frequency offset further includes a non-selecting part 60. The non-selecting part 60 selects at least one among the comparison result values C0 to C6 to be removed from the objects for the logic OR operations by the OR gate according to non-selection signal B0 to B6. Each of the non-selection signals B0 to B6 has the logic value of "0" or "1".

The non-selecting part 60 includes AND gate parts 60-0 to 60-6. The AND gate part 60-0 outputs a logic AND value of the comparison result value C0 and the non-selection signal B0. When the logic value of the non-selection signal B0 is "1", the comparison result value C0 is excluded from the logic AND objects and the output of the AND gate part 60-0 has the logic value of "1" regardless of the logic value of the comparison result value C0. Meanwhile, when the logic value of the non-selection signal B0 is "0", the comparison result value C0 is included in the logic AND objects and the output of the AND gate part 60-0 has the logic value of "0" or "1" according to the logic value of the comparison result value C0.

Similarly, the AND gate parts 60-1 to 60-5 output logic AND values of the comparison result value C1 and the non-section signal B1, the comparison result value C2 and the non-section signal B2, the comparison result value C3 and the non-section signal B3, the comparison result value C4 and the non-section signal B4, the comparison result value C5 and the non-section signal B5, and the comparison result value C6 and the non-section signal B6, respectively.

The OR gate part 15 outputs the logic OR of the comparison result values (at least one of C0 to C6) except for the comparison result value which is non-selected by the non-selecting part 60. For example, the comparison result values C0 to C3, C5 and C6 may be selected when the logic values of the non-section signals are "0", and when the logic value of the non-selection signal is "1", the comparison result value C4 may be non-selected. In this case, even if the difference between the sample levels D4 and D6 is equal to or less than the determination value 1, when other comparison conditions are satisfied, the OR gate part 15 provides the logic value of "1" to the differentiating circuit 16.

The average value calculating part 17 is allowed to calculate all average values of the sample levels D0 to D8 regardless of the contents of the non-selection signals B0 to B6, and may exclude at least one of the sample levels D0 to D8 from the average value calculation objects according to the contents of the non-selection signals B0 to B6. For example, as described above, when only the logic value of the non-selection signal B4 is "1", the sample levels D4 and D6 may be excluded from the calculation objects.

Thus, according to the circuit 10 for removing a frequency offset of the embodiment, by excluding at least one of the comparison result values C0 to C6 through a non-selection from the logic OR objects of the OR gate part 15, the determination condition in setting the determination threshold value may be varied.

This application is based on Japanese Patent Application No. 2011-270208 which is herein incorporated by reference.

What is claimed is:

1. A circuit for removing a frequency offset of a baseband signal, the circuit comprising:
    a sampling circuit for sampling a frequency level of the baseband signal at every 0.5 symbol interval to obtain a sequence of sample levels;
    a first difference absolute value calculating part for calculating first absolute values of differences between the frequency levels adjacent to each other at every 1 symbol based on an arbitrary first frequency level of the sample levels as a plurality of first difference absolute values;
    a second difference absolute value calculating part for calculating second absolute values of differences between the frequency levels adjacent to each other at every 1 symbol based on a second frequency level of the sample levels after 0.5 symbol from the first frequency level as a plurality of second difference absolute values;
    an average calculating part for calculating an average value of the sequence of the sample levels used for calculating the first and second difference absolute values; and
    a frequency offset holding part for setting the average value calculated by the average calculating part into the frequency offset when the first difference absolute values are greater than a predetermined first determination value or the second difference absolute values are less than a predetermined second determination value.

2. The circuit of claim 1, wherein the frequency offset is calculated when all of the first difference absolute values are greater than the first determination value.

3. The circuit of claim 2, wherein the frequency offset is calculated when all of the second difference absolute values are less than the second determination value.

4. The circuit of claim 1, wherein the frequency offset is calculated when all of the second difference absolute values are less than the second determination value.

5. A method for removing a frequency offset utilizing a circuit, the method comprising:
- setting a first frequency level as a frequency level at an arbitrary first timing of a baseband signal, and calculating first absolute values of differences between frequency levels adjacent to each other at every 1 symbol based on the first timing as a plurality of first difference absolute values;
- setting a second frequency level as a frequency level of the baseband signal at a second timing after 0.5 symbol from the first timing, and calculating second absolute values of differences between frequency levels adjacent to each other at every 1 symbol based on the second timing as a plurality of second difference absolute values; and
- calculating, as the frequency offset, at least one average value of a first average value as an average value of frequency levels used for calculating the first difference absolute value or a second average value as an average value of frequency levels used for calculating the second difference absolute value when the first difference absolute values are greater than a predetermined first determination value or the second difference absolute values are less than a predetermined second determination value.

6. The method of claim 5, wherein the calculating of the frequency offset includes calculating the frequency offset as an average value of the first and second average values.

7. The method of claim 6, wherein the calculating of the frequency offset includes calculating the frequency offset when all of the first difference absolute values is greater than the first determination value.

8. The method of claim 7, wherein the calculating of the frequency offset includes calculating the frequency offset when all of the second difference absolute values is less than the second determination value.

9. The method of claim 6, wherein the calculating of the frequency offset includes calculating the frequency offset when all of the second difference absolute values is less than the second determination value.

10. The method of claim 5, wherein the calculating of the frequency offset includes calculating the frequency offset when all of the first difference absolute values is greater than the first determination value.

11. The method of claim 10, wherein the calculating of the frequency offset includes calculating the frequency offset when all of the second difference absolute values is less than the second determination value.

12. The method of claim 5, wherein the calculating of the frequency offset includes calculating the frequency offset when all of the second difference absolute values is less than the second determination value.

13. A communication apparatus which includes a detection part for detecting a received signal to generate a baseband signal, a frequency offset removing circuit for removing a frequency offset of the baseband signal, and a demodulating part for demodulating the received signal based on the baseband signal from which the frequency offset is removed, the communication apparatus comprising:
- a sampling circuit for sampling a frequency level of the baseband signal at every 0.5 symbol interval to obtain a sequence of sample levels;
- a first difference absolute value calculating part for calculating first absolute values of differences between the frequency levels adjacent to each other at every 1 symbol based on an arbitrary first frequency level of the sample levels as a plurality of first difference absolute values;
- a second difference absolute value calculating part for calculating second absolute values of differences between the frequency levels adjacent to each other at every 1 symbol based on a second frequency level of the sample levels after 0.5 symbol from the first frequency level as a plurality of second difference absolute values;
- an average calculating part for calculating an average value of the sequence of the sample levels used for calculating the first and second difference absolute values; and
- a frequency offset holding part for setting the average value calculated by the average calculating part into the frequency offset when the first difference absolute values are greater than a predetermined first determination value or the second difference absolute values are less than a predetermined second determination value.

* * * * *